United States Patent [19]

Cambou

[11] Patent Number: 4,902,633

[45] Date of Patent: Feb. 20, 1990

[54] PROCESS FOR MAKING A BIPOLAR INTEGRATED CIRCUIT

[75] Inventor: Bertrand F. Cambou, Mesa, Ariz.

[73] Assignee: Motorola, Inc., Schaumburg, Ill.

[21] Appl. No.: 191,461

[22] Filed: May 9, 1988

[51] Int. Cl.$^4$ .......................................... H01L 21/265
[52] U.S. Cl. ............................................ 437/31; 437/81;
  437/152; 148/DIG. 11; 148/DIG. 37; 357/34
[58] Field of Search ...................... 437/31, 32, 33, 26,
  437/97, 98, 81, 82, 152; 148/DIG. 10, DIG. 11,
  DIG. 37; 357/34, 39

[56] References Cited

U.S. PATENT DOCUMENTS

| | | | |
|---|---|---|---|
| Re. 30,282 | 5/1980 | Hunt . | |
| 3,473,977 | 10/1969 | Skansan | 148/DIG. 37 |
| 3,544,863 | 12/1970 | Price | 148/DIG. 37 |
| 3,622,842 | 11/1971 | Oberal | 148/DIG. 37 |
| 3,638,301 | 2/1972 | Matsurua | 148/DIG. 37 |
| 3,759,760 | 9/1973 | Encinas . | |
| 3,912,555 | 10/1975 | Tsuyuki | 148/DIG. 37 |
| 3,982,974 | 9/1976 | Edel . | |
| 4,111,720 | 9/1978 | Michel | 437/31 |
| 4,593,457 | 6/1986 | Birrittella | 437/31 |
| 4,717,681 | 1/1988 | Curran | 437/31 |
| 4,746,629 | 5/1988 | Hanagasaki | 437/31 |
| 4,780,430 | 10/1988 | Musumeci | 437/31 |

FOREIGN PATENT DOCUMENTS 0210659 12/1983 Japan ................................ 437/31

Primary Examiner—Brian E. Hearn
Assistant Examiner—Kevin McAndrews
Attorney, Agent, or Firm—Joe E. Barbee

[57] ABSTRACT

A bipolar integrated circuit requiring less silicon area is provided by the use of a three layer epitaxy on top of a substrate. The first epitaxial layer is of the same conductivity type as the substrate and adds additional height to the substrate surrounding the buried layer. The buried layer serves as a collector and it is surrounded by an isolation area. The top two epitaxial layers are of a conductivity type opposite to that of the substrate with the upper most epitaxial layer having a higher dopant density than does the middle epitaxial layer. A master mask is used to provide self-alignment between the isolation area, a collector plug which makes contact to the buried layer, and a base region.

8 Claims, 3 Drawing Sheets

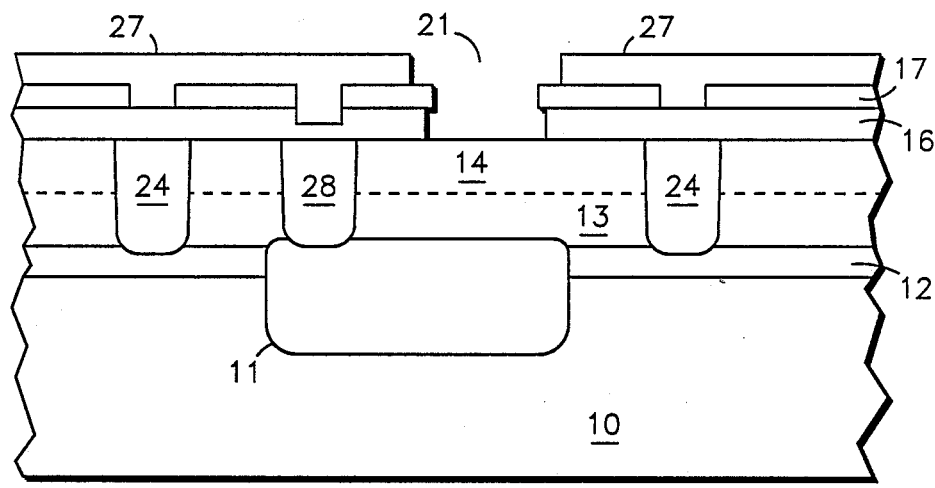
FIG. 8
FIG. 9
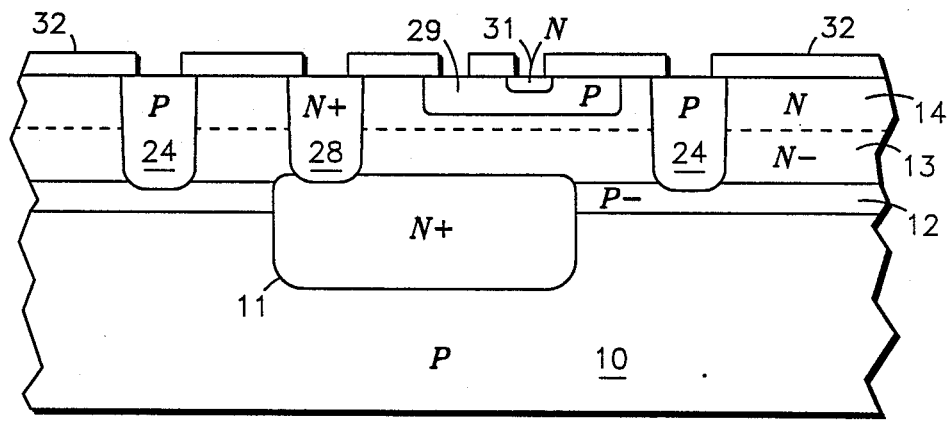

PROCESS FOR MAKING A BIPOLAR INTEGRATED CIRCUIT

BACKGROUND OF THE INVENTION

This invention relates, in general, to a method for making semiconductor integrated circuits, and more particularly, to a process for making a high voltage bipolar transistor integrated circuit.

The present technique for making high voltage (between 20 volts and 150 volts) bipolar transistors uses a low doped, thick silicon epitaxial layer. This thick silicon epitaxial layer causes some undesirable limitations. As an example, in order to create an isolation region for a transistor, long drive in times, at high temperatures, are necessary in order to drive in the dopants to create the isolation area. As a consequence, the lateral diffusion of the isolation area increases the minimum transistor size. Also such thermal cycles enhance the up diffusion of the buried layer thus reducing the active silicon layer under the bipolar transistor base. In this type of process the epitaxial layer must be thick in order to ensure an effective active layer underneath the base area. An example of such a device can be found in U.S. Pat. No. 3,982,974, which issued to Edel et al on Sept. 28, 1976.

The low dopant concentration necessary for the higher voltage bipolar transistors allows an increase in the expansion of the depletion spread between the base area and the isolation area. This results in requiring the spaces between these areas to be increased. Also the devices are extremely sensitive to the surface effects at the interface between the silicon epitaxial layer and a covering oxide layer. Often guard rings are required in order to eliminate the parasitic effects occurring near the surface. Therefore, it would be desirable to eliminate some of the negative effects of the thick epitaxial layer in order to increase the circuit density or the number of circuits per unit of silicon area.

Accordingly, it is an object of the present invention to provide an improved bipolar integrated circuit.

Another object of the present invention is to provide a high voltage bipolar integrated circuit having a reduced size.

Yet another object of the present invention is to provide a three layer epitaxial process with self-aligned isolation for highly dense and low cost high voltage bipolar integrated circuits.

Yet a further object of the present invention is to provide a bipolar integrated circuit capable of handling a higher voltage yet consuming less silicon area.

SUMMARY OF THE INVENTION

The above and other objects and advantages of the present invention are provided by the use of a three layer epitaxy on top of a substrate. First, a buried layer is provided in the substrate. The entire substrate is then covered with an epitaxial layer of the same conductivity type as the substrate. This first epitaxial layer adds additional height to the substrate above the buried layer. A second epitaxial layer is provided over the first epitaxial layer and is of an opposite conductivity type. A third epitaxial layer of the opposite conductivity type is provided over the second epitaxial layer and has a dopant concentration greater than the dopant concentration of the second epitaxial layer. By having the third epitaxial layer of a higher dopant concentration the surface effects are reduced.

Dopants to form an isolation area are provided in the third epitaxial layer. The dopant for the isolation area is of the same conductivity type as the substrate.ND dopants of the opposite conductivity type are also provided in the third epitaxial layer. All the dopants are diffused so that the isolation region reaches from the surface of the third epitaxial layer down to the first epitaxial layer and the dopants of the opposite conductivity type reach from the surface of the third epitaxial layer down to the buried layer. During the diffusion the buried layer also diffuses upward and meets with the dopants of the opposite conductivity type. A base region is then formed over the buried layer, and then the emitter area is formed inside the base region.

BRIEF DESCRIPTION OF THE DRAWINGS

FIGS. 1–8 illustrate in outline form progressive steps in the method of practicing the present invention; and FIG. 9 is a continuation of the process and illustrates in cross-sectional view a portion of an integrated circuit with one bipolar transistor near its completion stage.

DETAILED DESCRIPTION OF THE INVENTION

Figure 1:
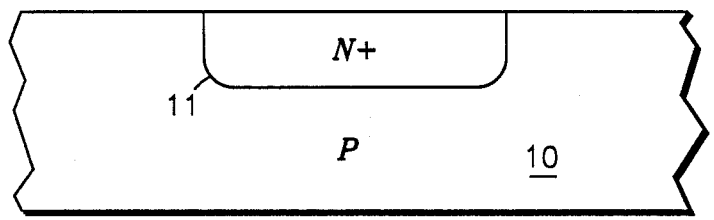

A method of manufacturing an integrated circuit containing bipolar devices will now be described in conjunction with the figures. An understanding of the present invention can be obtained through the explanation of the manufacturing of a single bipolar device as illustrated in the drawings; however, it will be understood that an integrated circuit contains many such devices or other devices such as PNP transistors, diodes, capacitors, resistors, etc. with or without the NPN transistor illustrated. To simplify the explanation, conventional process steps will be described only briefly, while those steps relating to the novel aspects of the process will be described in greater detail.

FIG. 1 illustrates a cross-sectional view of a small portion of a semiconductor substrate 10 having diffused dopants 11. Substrate 10 is of P conductivity type material having a top surface from which N+conductivity type dopant extends to form a buried layer 11.

Figure 2:
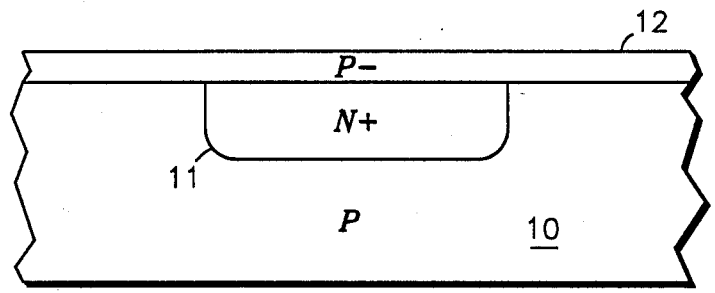

FIG. 2 illustrates an epitaxial layer 12 grown over substrate 10 and covering buried layer 11. Epitaxial layer 12 is of lightly doped P conductivity type material. The resistivity of epitaxial layer 12 will be close to the resistivity of substrate 10. Epitaxial layer 12 serves as a capping layer to prevent auto doping during subsequent processing steps. As will be seen subsequently epitaxial layer 12 also provides additional height of P conductivity type substrate 10 around buried layer 11.

Figure 3:
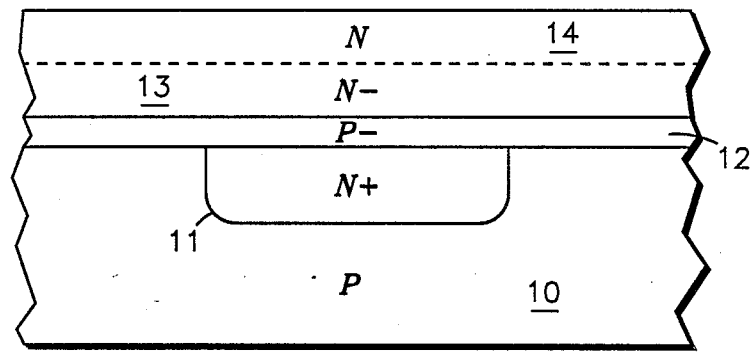

FIG. 3 illustrates two additional epitaxial layers covering first epitaxial layer 12. Second epitaxial layer 13 is directly on top of epitaxial layer 12 and is of a lightly doped N conductivity type material. Third epitaxial layer 14 covers epitaxial layer 13 and is also of N conductivity type material which has a higher dopant concentration than does epitaxial layer 13. There are advantages resulting from the two step N conductivity type epitaxial layers which will be more apparent hereinafter. By way of example only and not as a limitation, in one embodiment, the dopant concentration of buried layer 11 is $5 \times 10^{18}$ atoms per cubic centimeter, the dopant concentration of epitaxial layer 12 is $1 \times 10^{15}$ atoms per cubic centimeter, the dopant concentration of epitaxial layer 13 is $1 \times 10^{15}$ atoms per cubic centimeter, and the dopant concentration of epitaxial layer 14 is $2 \times 10^{15}$ atoms per cubic centimeter. Typically, the dopant concentration of epitaxial layer 14 is twice that of epitaxial layer 13. The dopant concentration of epitaxial layer 14 can range from $1 \times 10^{15}$ atoms per cubic centimeter to $5 \times 10^{15}$ atoms per cubic centimeter depending upon the desired breakdown voltage characteristics of the resulting transistor. The higher the dopant concentration the lower the voltage. As an example, for a dopant concentration of $1 \times 10^{15}$ for epitaxial layer 14 the resulting device will be a 120 volt transistor, and for a dopant concentration of $5 \times 10^{15}$ the resulting device will be a 25 volt transistor with the appropriate epitaxy thickness.

Figure 4:
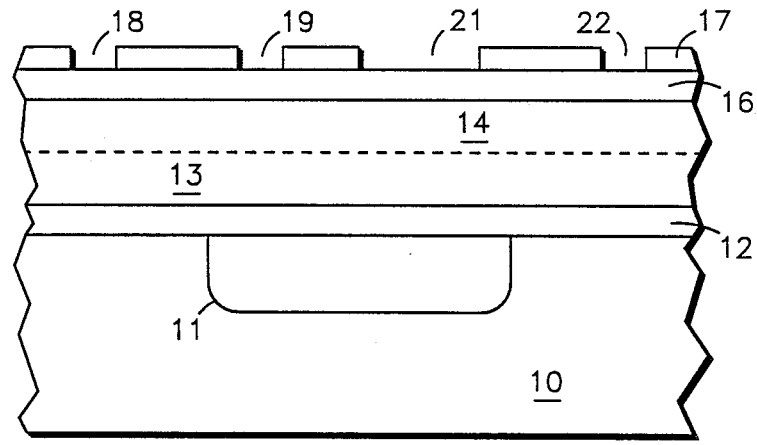

FIG. 4 illustrates the integrated circuit further along in its process. An oxide layer 16 has been grown over epitaxial layer 14. A dielectric layer 17 has been grown over oxide layer 16. Dielectric layer 17 can be any suitable material such as silicon nitride or the like. Dielectric layer 17 has been patterned by using well known techniques to provide openings 18, 19, 21, and 22. Openings 18 and 22 define the location for an isolation region, opening 19 defines the location for a collector plug, and opening 21 defines the location for a base region. By using dielectric layer 17 as a master mask, self-alignment results between the isolation region, the collector plug, and the base region. A master mask technique is described in U.S. Pat. Reissue No. 30,282, reissued on May 27, 1980 to Hunt et al.

Figure 5:
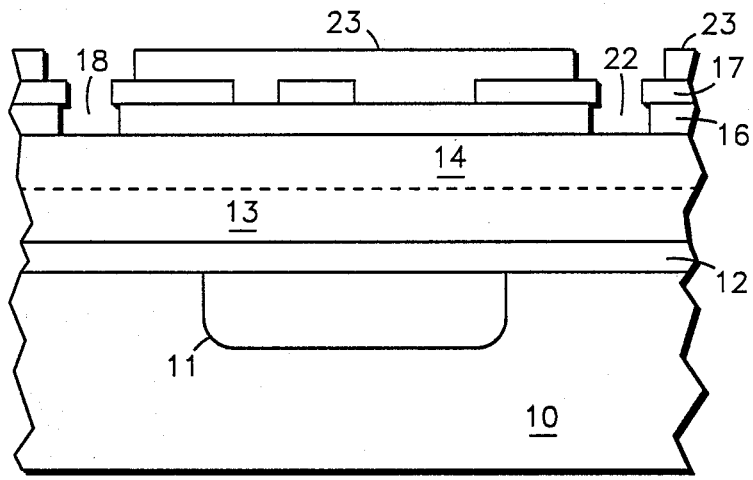

FIG. 5 shows a patterned layer of photoresist 23 covering the integrated circuit. Photoresist 23 is patterned to prevent covering openings 18 and 22. Using conventional techniques, the portion of oxide layer 16 existing in openings 18 and 22 has been suitably etched away to expose the top surface of epitaxial layer 14. This permits the placement of dopants through openings 18 and 22 to provide an isolation region.

Figure 6:
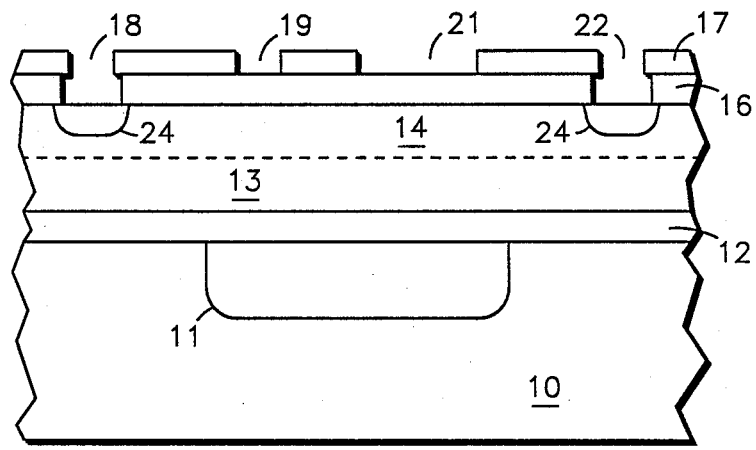

FIG. 6 illustrates these dopants as regions 24. In addition, FIG. 6 shows that photoresist 23 has been removed. Note that the dopants 24 are not completely diffused at this point in time, and form a continuous perimeter to completely surround the resulting bipolar device.

Figure 7:
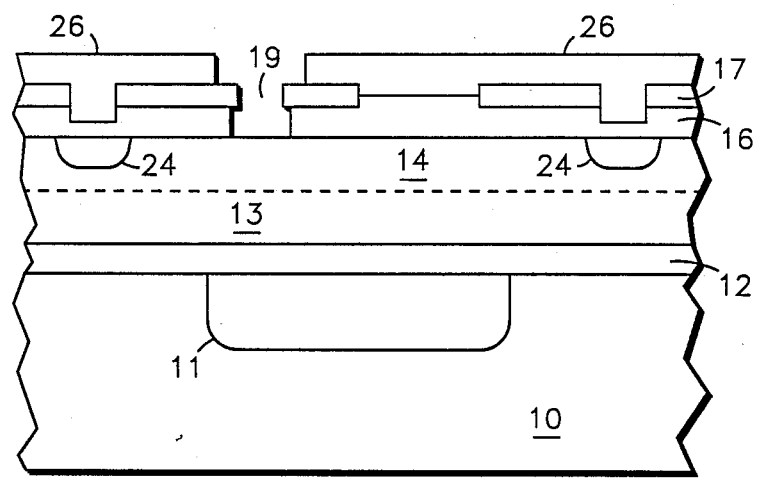

FIG. 7 illustrates the integrated circuit having a new layer of patterned photoresist 26. Photoresist 26 has been patterned to expose opening 19. It can also be seen, in FIG. 7, that additional oxide has been grown and covers the portions of epitaxial layer 14 that were exposed in FIG. 6. At the same time additional oxide was grown in opening 21. After the growth of the additional oxide, photoresist 26 is applied and then oxide 16 that existed through opening 19 is etched away to expose epitaxial layer 14 through opening 19. An N type dopant is then introduced into epitaxial layer 14 through opening 19. Once this dopant is introduced into epitaxial layer 14 a diffusion step is performed to drive in that dopant along with the dopants 24.

This diffusion step will produce isolation regions 24 and collector plug 28 illustrated in FIG. 8. Also note that buried layer 11 has diffused upward through epitaxial layer 12. Since epitaxial layer 12 has provided an additional height to substrate 10, isolation region 24 does not have to diffuse as deeply as it had to in prior art devices. As is well recognized, not only does the dopant provided for isolation region 24 diffuse downward but it also diffuses laterally and therefore by shortening the distance that the dopants must diffuse downwardly this also reduces the amount of lateral diffusion that occurs.

Since the amount of lateral diffusion is reduced, the overall area provided for the bipolar device can be reduced also. It has been found that using the present invention results in approximately 50% reduction in the amount of silicon area required. FIG. 8 also illustrates that photoresist layer 26 has been removed and additional oxide grown in order to cover the portion of epitaxial layer 14 exposed through opening 19. Then a patterned layer of photoresist 27 is applied which has an opening to coincide with opening 21. The portion of oxide layer 16 existing in opening 21 is etched away to expose that portion of epitaxial layer 14 existing under opening 21. A P type dopant is then added through opening 21 to provide base area 29 (shown in FIG. 9). After base well or region 29 is formed photoresist 27, dielectric layers 17, and oxide layer 16 are all removed.

As shown in FIG. 9, a new layer of oxide 32 is then grown over the integrated circuit and patterned to provide metal contact areas and to provide emitter area 31. Emitter area 31 is made from N type dopants. The metal layer provided to make contact through the openings in oxide layer 32 are not illustrated since these are well known to those skilled in the art. In a typical integrated circuit, multiple metal layers are generally required. In a typical device the dopant concentrations provided in base well or region 29 are $5 \times 10^{18}$ atoms per cubic centimeter and are of P type while the dopant concentration in emitter area 31 are $1 \times 10^{21}$ atoms per cubic centimeter. In one embodiment of the present invention, epitaxial layer 12 is approximately 4 microns thick, epitaxial layer 13 is approximately 10 microns thick, and epitaxial layer 14 is approximately 5 microns thick. The dopant concentration of isolation area 24 is $2 \times 10^{19}$ atoms per cubic centimeter and the dopant concentration of collector plug 28 is $5 \times 10^{19}$ atoms per cubic centimeter. These parameters will vary depending on the desired breakdown voltage.

The preferred dopant to use in buried layer 11 is antimony because it exhibits less severe auto doping than does arsenic or phosphorus. Epitaxial layers 13 and 14 are doped with arsenic. Epitaxial layer 12 is doped with boron.

Several advantages are achieved by having higher dopants in epitaxial layer 14 than exist in epitaxial layer 13. First the surface effects are reduced. As an example, the MOS field effect transistor action between base region 29 and isolation area 24 is decreased since the higher doped surface layer causes the threshold voltage of this parasitic MOS field effect transistor to be higher. The highly doped surface epitaxial layer 14 also helps to neutralize the charge in oxide layer 32. Thirdly the highly doped epitaxial layer 14 permits a shrinking of the spacing rules because base region 29 does not spread as far in the lateral direction through the highly doped epitaxial layer 14. A fourth benefit achieved by the dual epitaxial layers 13 and 14 is that the breakdown voltage of the bipolar transistor increases because of the lower dopants in epitaxial layer 13.

By now it should be appreciated that there has been provided a new and improved bipolar integrated circuit which requires less silicon area. The number of critical process steps in making the integrated circuit is reduced by the use of a master mask.

I claim:

1. A process for making a bipolar integrated circuit, comprising: providing a substrate of a first conductivity type and having a first surface; selectively forming a buried layer of a second conductivity type in the substrate and extending from the first surface; providing a first epitaxial layer of the first conductivity type over the first surface; providing a second epitaxial layer of the second conductivity type over the first epitaxial layer; providing a third epitaxial layer of the second conductivity type over the second epitaxial layer and having a higher dopant concentration than the second epitaxial layer; selectively providing a dopant of the first conductivity type in the third epitaxial layer in a manner to surround the buried layer; selectively providing a dopant of the second conductivity type in the third epitaxial layer and positioned over a portion of the buried layer; and performing a diffusion to drive in the dopants selectively provided in the third epitaxial layer and simultaneously causing the buried layer to diffuse upwards.

2. The process of claim 1 further including selectively providing a base well of the first conductivity type in the third epitaxial layer over a portion of the buried layer and providing an emitter area in the base well.

3. The process of claim 1 wherein the dopant concentration in the third epitaxial layer is approximately twice the dopant concentration in the second epitaxial layer.

4. The process of claim 1 wherein the selectively provided dopant of the first conductivity extends to the first epitaxial layer and the selectively provided dopant of the second conductivity extends to the buried layer.

5. A method for making an integrated circuit, comprising: providing a substrate of a first conductivity type and having a first surface; providing a dopant of a second conductivity type into the substrate and extending from the first surface; providing a first epitaxial layer of the first conductivity type over the first surface; providing a second epitaxial layer of the second conductivity type over the first epitaxial layer; providing a third epitaxial layer of the second conductivity type over the second epitaxial layer, the third epitaxial layer being of a dopant concentration higher than the second epitaxial layer; providing a layer of oxide over the third epitaxial layer; providing a dielectric layer over the layer of oxide; using a master mask to selectively provide openings in the dielectric layer for an isolation region, a collector plug, and a base region; etching thru the oxide in the opening provided for the isolation region and providing a dopant of the first conductivity; masking over all the openings except the opening for the collector plug; etching through the oxide in the collector plug opening and providing a dopant of the second conductivity type in the collector plug opening; diffusing the dopants in the isolation region, in the collector plug, and in the buried layer; masking over all the openings except for the base region opening; forming a base region of the first conductivity type through the base region opening; and forming an emitter area of the second conductivity type in the base region.

6. The method of claim 5 wherein the dielectric is silicon nitride.

7. The method of claim 5 wherein forming the base region includes etching through the oxide in the base region opening and implanting dopants and diffusing the dopants in the base region.

8. A method of providing a bipolar integrated circuit, comprising: providing a substrate having a first surface and being of a first conductivity type; selectively providing a buried layer of a second conductivity type and having a dopant concentration of approximately $5 \times 10^{18}$ atoms per cubic centimeter, the buried layer being provided in the substrate; providing a first epitaxial layer of a first conductivity type over the first surface; providing a second epitaxial layer of a second conductivity type over the first epitaxial layer; providing a third epitaxial layer of the second conductivity type over the second epitaxial layer, the third epitaxial layer having a dopant concentration nearly twice the dopant concentration of the second epitaxial layer; selectively providing dopants in the third epitaxial layer of the first conductivity type for an isolation area; selectively providing dopants of the second conductivity type in the third epitaxial layer for a collector plug; diffusing the selectively provided dopants to form an isolation area having a dopant concentration of approximately $2 \times 10^{19}$ atoms per cubic centimeter and to form a collector plug having a dopant concentration of approximately $5 \times 10^{19}$ atoms per cubic centimeter and extending thru the third and second epitaxial layers to contact the buried layer; selectively forming a base area having dopant concentration of the first conductivity type of approximately $5 \times 10^{18}$ atoms per cubic centimeter; and forming an emitter area in the base area.

* * * * *